United States Patent
Shimomura et al.

(10) Patent No.: US 8,030,177 B2
(45) Date of Patent: Oct. 4, 2011

(54) METHOD FOR MANUFACTURING SEMICONDUCTOR DEVICES USING EMBRITTLED LAYERS

(75) Inventors: Akihisa Shimomura, Atsugi (JP); Masaki Koyama, Atsugi (JP); Yasuhiro Jinbo, Atsugi (JP); Naoki Okuno, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 136 days.

(21) Appl. No.: 12/615,613

(22) Filed: Nov. 10, 2009

(65) Prior Publication Data

US 2010/0120224 A1     May 13, 2010

(30) Foreign Application Priority Data

Nov. 13, 2008   (JP) .................. 2008-290500

(51) Int. Cl.
  *H01L 21/30* (2006.01)
  *H01L 21/46* (2006.01)
(52) U.S. Cl. ........ 438/458; 438/455; 438/149; 438/150; 438/151; 257/350; 257/E21.7; 257/E23.002
(58) Field of Classification Search .......... 438/149, 438/150, 151, 455, 458; 257/350, E21.7, 257/E23.002
  See application file for complete search history.

(56) References Cited

U.S. PATENT DOCUMENTS

| | | | |
|---|---|---|---|
| 4,933,298 A | 6/1990 | Hasegawa | |
| 6,320,228 B1 * | 11/2001 | Yu | 257/350 |
| 6,372,609 B1 | 4/2002 | Aga et al. | |
| 6,777,309 B1 * | 8/2004 | Liao et al. | 438/458 |
| 6,982,181 B2 * | 1/2006 | Hideo | 438/30 |
| 7,176,072 B2 * | 2/2007 | Lee et al. | 438/149 |
| 7,179,719 B2 * | 2/2007 | Droes et al. | 438/458 |
| 7,358,147 B2 * | 4/2008 | Morimoto et al. | 438/406 |
| 7,488,980 B2 * | 2/2009 | Takafuji et al. | 257/64 |
| 7,659,582 B2 * | 2/2010 | Droes et al. | 257/347 |
| 7,919,392 B2 * | 4/2011 | Takafuji et al. | 438/455 |
| 2001/0019153 A1 * | 9/2001 | Sato et al. | 257/347 |
| 2001/0053607 A1 * | 12/2001 | Sakaguchi et al. | 438/700 |
| 2003/0087503 A1 * | 5/2003 | Sakaguchi et al. | 438/406 |
| 2004/0119100 A1 | 6/2004 | Nowak et al. | |

(Continued)

FOREIGN PATENT DOCUMENTS

JP          03-285351       12/1991

(Continued)

*Primary Examiner* — Thao Le
*Assistant Examiner* — Eric Jone
(74) *Attorney, Agent, or Firm* — Eric J. Robinson; Robinson Intellectual Property Law Office, P.C.

(57) ABSTRACT

An object is to provide a method for manufacturing an SOI substrate including a single crystal silicon film whose plane orientation is (100) and a single crystal silicon film whose plane orientation is (110) with high yield. A first single crystal silicon substrate whose plane orientation is (100) is doped with first ions to form a first embrittlement layer. A second single crystal silicon substrate whose plane orientation is (110) is doped with second ions to selectively form a second embrittlement layer. Only part of the first single crystal silicon substrate is separated along the first embrittlement layer by first heat treatment, thereby forming a first single crystal silicon film. A region of the second single crystal silicon substrate, in which the second embrittlement layer is not formed, is removed. Part of the second single crystal silicon substrate is separated along the second embrittlement layer by second heat treatment, thereby forming a second single crystal silicon film.

4 Claims, 13 Drawing Sheets

U.S. PATENT DOCUMENTS

| | | | |
|---|---|---|---|
| 2004/0147092 A1* | 7/2004 | Liao et al. | 438/438 |
| 2004/0183133 A1* | 9/2004 | Takafuji et al. | 257/347 |
| 2005/0029224 A1* | 2/2005 | Aspar et al. | 216/33 |
| 2005/0032283 A1* | 2/2005 | Itoga et al. | 438/149 |
| 2005/0067619 A1* | 3/2005 | Takafuji et al. | 257/66 |
| 2005/0087739 A1* | 4/2005 | Ogawa et al. | 257/59 |
| 2005/0173761 A1* | 8/2005 | Takafuji et al. | 257/347 |
| 2005/0260800 A1 | 11/2005 | Takano | |
| 2005/0266591 A1* | 12/2005 | Hideo | 438/22 |
| 2006/0068565 A1* | 3/2006 | Droes et al. | 438/458 |
| 2006/0172467 A1* | 8/2006 | Lee et al. | 438/149 |
| 2007/0108523 A1* | 5/2007 | Ogawa et al. | 257/347 |
| 2007/0122998 A1* | 5/2007 | Droes et al. | 438/458 |
| 2008/0283958 A1* | 11/2008 | Ohnuma | 257/506 |
| 2009/0050941 A1* | 2/2009 | Yamazaki et al. | 257/255 |
| 2009/0078939 A1* | 3/2009 | Yamazaki et al. | 257/59 |
| 2009/0095956 A1* | 4/2009 | Takafuji et al. | 257/49 |
| 2009/0191671 A1* | 7/2009 | Takafuji et al. | 438/151 |
| 2009/0206495 A1* | 8/2009 | Itoga et al. | 257/797 |
| 2009/0269907 A1* | 10/2009 | Takafuji et al. | 438/458 |

FOREIGN PATENT DOCUMENTS

| | | |
|---|---|---|
| JP | 2000-124092 | 4/2000 |
| JP | 2006-012995 | 1/2006 |

* cited by examiner

METHOD FOR MANUFACTURING SEMICONDUCTOR DEVICES USING EMBRITTLED LAYERS

BACKGROUND OF THE INVENTION

1. Field of the Invention

The present invention relates to a method for manufacturing a semiconductor device using an SOI (silicon on insulator) substrate.

2. Description of the Related Art

A substrate (an SOI substrate) in which single crystal silicon is provided on an insulating film has been used for high-speed operation and low power consumption of a semiconductor device. A semiconductor device including an N-channel thin film transistor (TFT) and a P-channel TFT has been manufactured with the use of an SOI substrate.

It is generally known that the most suitable orientation of silicon for a TFT varies depending on the structure and use application of the TFT. Single crystal silicon whose plane orientation is (100) is preferably used for a channel of an N-channel TFT while single crystal silicon whose plane orientation is (110) is preferably used for a channel of a P-channel TFT.

In Patent Document 1, an SOI substrate including single crystal silicon whose plane orientation is (100) and single crystal silicon whose plane orientation is (110) is disclosed. Further, a method for manufacturing a semiconductor device in which the single crystal silicon whose plane orientation is (100) is used for a channel of an N-channel TFT and the single crystal silicon whose plane orientation is (110) is used for a channel of a P-channel TFT is disclosed. The manufacturing method will be described below (FIGS. 1A to 1D).

A thermal oxide film 1001 is formed on a surface of a single crystal silicon substrate 1002 whose plane orientation is (110). The thermal oxide film 1001 and a single crystal silicon substrate 1000 whose plane orientation is (100) are bonded to each other. The bonding is performed by annealing at 1100° C. (FIG. 1A). The single crystal silicon substrate 1002 is made thinner by mechanical polishing and chemical etching, thereby forming a single crystal silicon film 1003. A thermal oxide film 1004 is formed on a bottom surface of the single crystal silicon film 1003. The thermal oxide film 1004 and a semiconductor substrate 1005 are bonded to each other (FIG. 1B).

The single crystal silicon substrate 1000 is polished and chemically etched, thereby forming a single crystal silicon film. The single crystal silicon film is formed into an island-like shape so as to form an active layer 1006 of an N-channel TFT 1013. The thermal oxide film 1001 is selectively removed, thereby exposing the single crystal silicon film 1003 which is to be an active layer of a P-channel TFT 1014 (FIG. 1C).

A gate insulating film 1009 is formed over the single crystal silicon film 1003, and a gate insulating film 1010 is formed over the active layer 1006. A gate electrode 1012 is formed over the gate insulating film 1009, and a gate electrode 1011 is formed over the gate insulating film 1010. Doping with N-type impurity ions is performed using the gate electrode 1011 as a mask, thereby forming a source region 1020 and a drain region 1008 of the N-channel TFT. Doping with P-type impurity ions is performed using the gate electrode 1012 as a mask, thereby forming a source region 1021 and a drain region 1007 of the P-channel TFT. Thus, part of the N-channel TFT 1013 in which the single crystal silicon having the (100) plane orientation is used for a channel formation region 1016 and part of the P-channel TFT 1014 in which the single crystal silicon having the (110) orientation is used for a channel formation region 1015 are formed (FIG. 1D). After that, an interlayer insulating film, a contact hole, a source electrode, and a drain electrode are formed.

However, it takes much time to form a single crystal silicon film by making a single crystal silicon substrate thinner by mechanical polishing and chemical etching as disclosed in Patent Document 1; moreover, it is difficult to control the amount of polishing and the amount of etching. As a method for forming a single crystal silicon film from a single crystal silicon substrate, there is a Smart Cut (registered trademark) method in addition to polishing and chemical etching. The Smart Cut method is a method by which a silicon substrate is doped with hydrogen ions so that an embrittlement layer is formed therein and a single crystal silicon film is separated along the embrittlement layer by heat treatment (e.g., Patent Document 2). In the Smart Cut method, by controlling acceleration energy and the dose of hydrogen ions, the thickness of a single crystal silicon film can be controlled.

The above method is applied to the manufacturing method of Patent Document 1 (FIGS. 2A to 2C). A single crystal silicon substrate 1100 whose plane orientation is (100) is doped with hydrogen ions 1105, thereby forming an embrittlement layer 1110. Energy of the hydrogen ions is adjusted so that the embrittlement layer 1110 is formed at a depth of greater than or equal to 50 nm and less than or equal to 200 nm from a surface of the single crystal silicon substrate 1100. Meanwhile, a single crystal silicon substrate 1102 whose plane orientation is (110) is also doped with hydrogen ions 1106 at the same dose as that of the hydrogen ions 1105, thereby forming an embrittlement layer 1111. Energy of the hydrogen ions is adjusted so that the embrittlement layer 1111 is formed at a depth of greater than or equal to 50 nm and less than or equal to 200 nm from a surface of the single crystal silicon substrate 1102 (FIG. 2A).

An oxide film 1101 is formed over the single crystal silicon substrate 1102 by a CVD method, a sputtering method, or the like (FIG. 2B).

Then, the oxide film 1101 and the single crystal silicon substrate 1100 having the (100) orientation are bonded to each other (FIG. 2B). If the bonding is performed by annealing, a single crystal silicon film 1112 and a single crystal silicon film 1113 are separated along the embrittlement layer 1110 and the embrittlement layer 1111, respectively (FIG. 2C). The single crystal silicon film 1112 and the single crystal silicon film 1113 each have a small thickness of greater than or equal to 50 nm and less than or equal to 200 nm; therefore, it is difficult to handle the films.

REFERENCE

[Patent Document 1] Japanese Published Patent Application No. H3-285351
[Patent Document 2] Japanese Published Patent Application No. 2000-124092

SUMMARY OF THE INVENTION

As described above, when the Smart Cut method is applied to the manufacturing method of Patent Document 1, it is difficult to handle single crystal silicon films and thus improvement of yield cannot be achieved. Therefore, a method for manufacturing an SOI substrate including a single crystal silicon film whose plane orientation is (100) and a single crystal silicon film whose plane orientation is (110) with high yield is disclosed in this specification.

A first single crystal silicon substrate is doped with first ions, thereby forming a first embrittlement layer. A second single crystal silicon substrate is doped with second ions, thereby selectively forming a second embrittlement layer. The dose of the second ions is smaller than the dose of the first ions. The first ions and the second ions are each hydrogen ions, or hydrogen ions and helium ions. Hydrogen ions include at least one of $H^+$, $H_2^+$, and $H_3^+$. After the first single crystal silicon substrate and the second single crystal silicon substrate are bonded to each other, first heat treatment is performed, so that only part of the first single crystal silicon substrate can be separated along the first embrittlement layer and thus a first single crystal silicon film can be formed. After a region of the second single crystal silicon substrate, in which the second embrittlement layer is not formed is removed, second heat treatment is performed, so that part of the second single crystal silicon substrate can be separated along the second embrittlement layer and thus a second single crystal silicon film can be formed. Note that the temperature of the second heat treatment is higher than the temperature of the first heat treatment. One of the first single crystal silicon substrate and the second single crystal silicon substrate is a single crystal silicon substrate whose plane orientation is (100), and the other thereof is a single crystal silicon substrate whose plane orientation is (110).

One embodiment of the present invention includes the steps of forming a first insulating film over a surface of a first single crystal silicon substrate; forming a second insulating film over a surface of a second single crystal silicon substrate; doping an entire surface of the first single crystal silicon substrate with first ions through the first insulating film to form a first embrittlement layer in the first single crystal silicon substrate; doping the second single crystal silicon substrate with second ions through the second insulating film to selectively form a second embrittlement layer in the second single crystal silicon substrate; bonding the first single crystal silicon substrate and the second single crystal silicon substrate to each other with the first insulating film and the second insulating film interposed therebetween; separating part of the first single crystal silicon substrate along the first embrittlement layer by first heat treatment to form a first single crystal silicon film over the second single crystal silicon substrate with the first insulating film and the second insulating film interposed therebetween; forming a third insulating film over the first single crystal silicon film; removing a region of the second single crystal silicon substrate, in which the second embrittlement layer is not formed; bonding a base substrate and the second single crystal silicon substrate to each other with the third insulating film interposed therebetween; separating part of the second single crystal silicon substrate along the second embrittlement layer by second heat treatment to form a second single crystal silicon film over the base substrate with the first insulating film and the second insulating film interposed therebetween; selectively removing the second single crystal silicon film to form an island-like second single crystal silicon film, and removing part of the first insulating film and part of the second insulating film to expose the first single crystal silicon film; and selectively removing the first single crystal silicon film to form an island-like first single crystal silicon film.

One embodiment of the present invention includes the steps of forming a first insulating film over a surface of a first single crystal silicon substrate; forming a second insulating film over a surface of a second single crystal silicon substrate; forming a first mask which entirely covers a peripheral portion of the second single crystal silicon substrate over the second insulating film; doping an entire surface of the first single crystal silicon substrate with first ions through the first insulating film to form a first embrittlement layer in the first single crystal silicon substrate; doping the second single crystal silicon substrate with second ions through the second insulating film with the use of the first mask to selectively form a second embrittlement layer in the second single crystal silicon substrate; removing the first mask; bonding the first single crystal silicon substrate and the second single crystal silicon substrate to each other with the first insulating film and the second insulating film interposed therebetween; separating part of the first single crystal silicon substrate along the first embrittlement layer by first heat treatment to form a first single crystal silicon film over the second single crystal silicon substrate with the first insulating film and the second insulating film interposed therebetween; forming a third insulating film over the first single crystal silicon film; forming a second mask which entirely covers the second embrittlement layer over the third insulating film; removing a peripheral portion of the third insulating film, a peripheral portion of the first insulating film, a peripheral portion of the second insulating film, and the peripheral portion of the second single crystal silicon substrate with the use of the second mask; bonding a base substrate and the second single crystal silicon substrate to each other with the third insulating film interposed therebetween; separating part of the second single crystal silicon substrate along the second embrittlement layer by second heat treatment to form a second single crystal silicon film over the base substrate with the first insulating film and the second insulating film interposed therebetween; selectively removing the second single crystal silicon film to form an island-like second single crystal silicon film, and removing part of the first insulating film and part of the second insulating film to expose the first single crystal silicon film; and selectively removing the first single crystal silicon film to form an island-like first single crystal silicon film.

In the above description, the dose of the second ions is smaller than the dose of the first ions. Accordingly, the temperature of the second heat treatment can be set higher than the temperature of the first heat treatment. By the first heat treatment, the first single crystal silicon film is formed but the second single crystal silicon film is not formed.

For example, the dose of the first ions is $2.5 \times 10^{16}$ to $2.7 \times 10^{16}$ $cm^{-2}$. The dose of the second ions is set smaller than the dose of the first ions, for example, set at $1.9 \times 10^{16}$ to $2.1 \times 10^{16}$ $cm^{-2}$. With this dose, the first single crystal silicon film can be formed by the first heat treatment at a temperature of 470 to 480° C., and the second single crystal silicon film can be formed by the second heat treatment at a temperature of 490° C. or higher, preferably at 490 to 500° C. When the dose of the second ions is smaller than the dose of the first ions by $0.5 \times 10^{16}$ to $1.0 \times 10^{16}$ $cm^{-2}$, the temperature of the second heat treatment can be set 10 to 20° C. higher than the temperature of the first heat treatment.

In the case where the plane orientation of a main surface of the first single crystal silicon substrate is (100), the plane orientation of a main surface of the second single crystal silicon substrate is (110). In the case where the plane orientation of the main surface of the first single crystal silicon substrate is (110), the plane orientation of the main surface of the second single crystal silicon substrate is (100). The first ions and the second ions are each hydrogen ions, or hydrogen ions and helium ions. Hydrogen ions include at least one of $H^+$, $H_2^+$, and $H_3^+$.

In the case where the plane orientation of the main surface of the first single crystal silicon substrate is (100) and the plane orientation of the main surface of the second single crystal silicon substrate is (110), one embodiment of the present invention includes steps in which a source region, a drain region, and a channel formation region of an N-channel TFT are formed in the island-like first single crystal silicon film and a source region, a drain region, and a channel formation region of a P-channel TFT are formed in the island-like second single crystal silicon film.

Furthermore, one embodiment of the present invention includes steps in which a first gate insulating film is formed over the island-like first single crystal silicon film, a first gate electrode is formed over the first gate insulating film, and N-type impurity ions are added to the island-like first single crystal silicon film with the use of the first gate electrode as a mask to form the source region, the drain region, and the channel formation region of the N-channel TFT; and steps in which a second gate insulating film is formed over the island-like second single crystal silicon film, a second gate electrode is formed over the second gate insulating film, and P-type impurity ions are added to the island-like second single crystal silicon film with the use of the second gate electrode as a mask to form the source region, the drain region, and the channel formation region of the P-channel TFT.

Alternatively, in the case where the plane orientation of the main surface of the first single crystal silicon substrate is (110) and the plane orientation of the main surface of the second single crystal silicon substrate is (100), one embodiment of the present invention includes steps in which a source region, a drain region, and a channel formation region of a P-channel TFT are formed in the island-like first single crystal silicon film and a source region, a drain region, and a channel formation region of an N-channel TFT are formed in the island-like second single crystal silicon film.

Furthermore, one embodiment of the present invention includes steps in which a first gate insulating film is formed over the island-like first single crystal silicon film, a first gate electrode is formed over the first gate insulating film, and P-type impurity ions are added to the island-like first single crystal silicon film with the use of the first gate electrode as a mask to form the source region, the drain region, and the channel formation region of the P-channel TFT; and steps in which a second gate insulating film is formed over the island-like second single crystal silicon film, a second gate electrode is formed over the second gate insulating film, and N-type impurity ions are added to the island-like second single crystal silicon film with the use of the second gate electrode as a mask to form the source region, the drain region, and the channel formation region of the N-channel TFT.

An SOI substrate including a single crystal silicon film whose plane orientation is (100) and a single crystal silicon film whose plane orientation is (110) can be manufactured with high yield.

DETAILED DESCRIPTION OF THE INVENTION

Figure 1A:
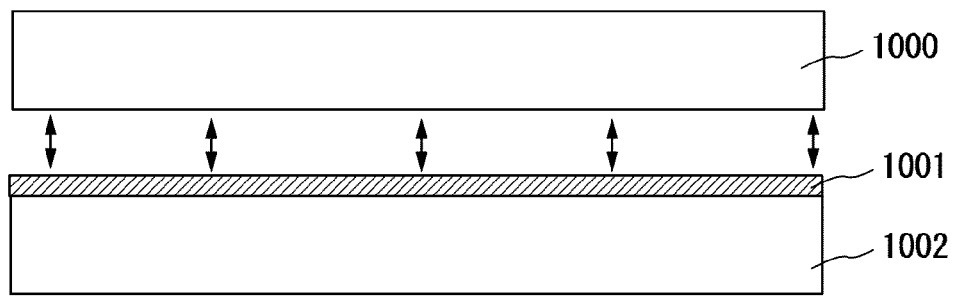
FIGS. 1A to 1D are views illustrating conventional art.
Figure 1B:
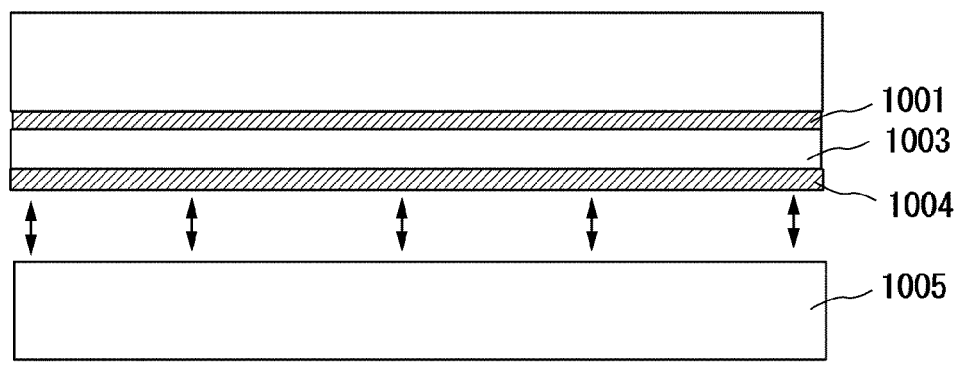
Figure 1C:
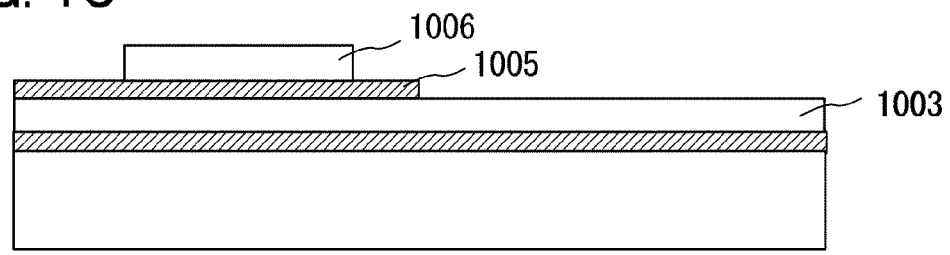
Figure 1D:
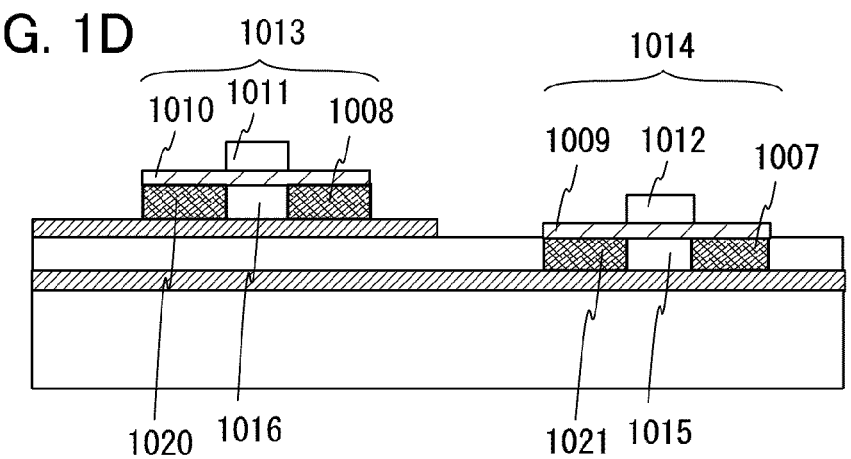
Figure 2A:
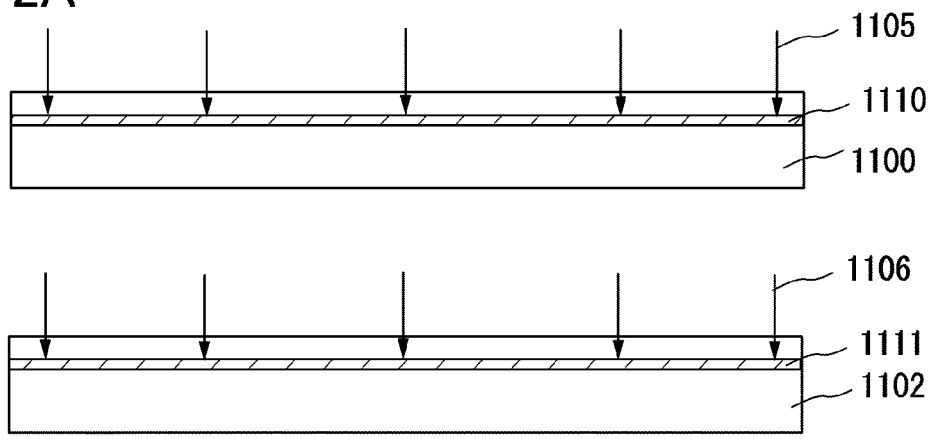
FIGS. 2A to 2C are views illustrating conventional art.
Figure 2B:
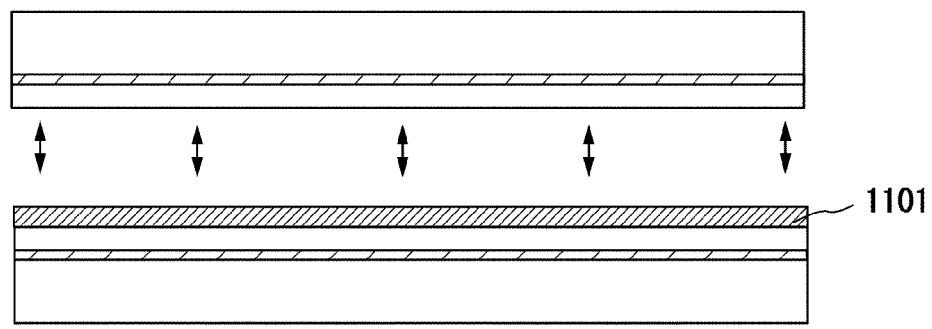
Figure 2C:
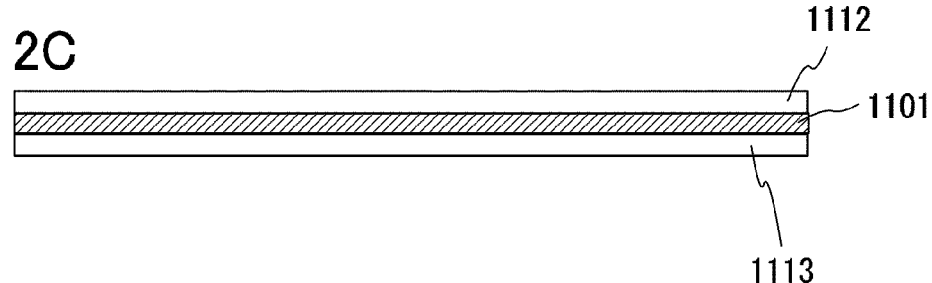

Embodiments of the present invention will be described below. Note that the present invention can be implemented in many different modes, and it is easily understood by those skilled in the art that the mode and detail can be changed variously without departing from the scope and spirit of the present invention. Therefore, the present invention should not be interpreted as being limited to the description of the embodiments. Note that the same reference numerals are commonly given to the same portions or portions having similar functions in different drawings, and repetitive explanation will be omitted in some cases.

Embodiment 1

The following steps will be described: a step of forming a first insulating film over a surface of a first single crystal silicon substrate; a step of forming a second insulating film over a surface of a second single crystal silicon substrate; a step of doping the first single crystal silicon substrate with first ions to form a first embrittlement layer; and a step of doping the second single crystal silicon substrate with second ions to selectively form a second embrittlement layer. The dose of the second ions is smaller than the dose of the first ions. Accordingly, the temperature of second heat treatment can be set higher than the temperature of first heat treatment.

Then, the following steps will be described: a step of bonding the first single crystal silicon substrate and the second single crystal silicon substrate to each other with the first insulating film and the second insulating film interposed therebetween; a step of separating part of the first single crystal silicon substrate along the first embrittlement layer by the first heat treatment to form a first single crystal silicon film over the second single crystal silicon substrate with the first insulating film and the second insulating film interposed therebetween; a step of forming a third insulating film over the first single crystal silicon film; a step of removing a region of the second single crystal silicon substrate, in which the second embrittlement layer is not formed; a step of bonding a base substrate and the second single crystal silicon substrate to each other with the third insulating film interposed therebetween; a step of separating part of the second single crystal silicon substrate along the second embrittlement layer by the second heat treatment to form a second single crystal silicon film over the base substrate with the first insulating film and the second insulating film interposed therebetween; a step of selectively removing the second single crystal silicon film to form an island-like second single crystal silicon film while removing part of the first insulating film and part of the second insulating film to expose the first single crystal silicon film; and a step of selectively removing the first single crystal silicon film to form an island-like first single crystal silicon film.

Figure 3A:
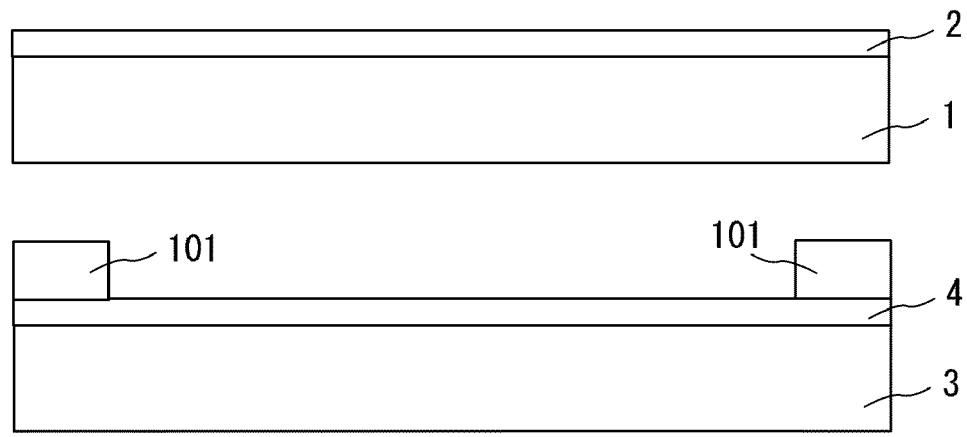
FIGS. 3A and 3B are views illustrating a manufacturing method of Embodiment 1.

An insulating film (the first insulating film) 2 is formed over a single crystal silicon substrate (the first single crystal silicon substrate) 1. Further, an insulating film (the second insulating film) 4 is formed over a single crystal silicon substrate (the second single crystal silicon substrate) 3 (FIG. 3A).

In this embodiment, the single crystal silicon substrate 1 has a main surface having a (100) plane orientation and is used for forming a source region, a drain region, and a channel formation region of an N-channel TFT. Meanwhile, the single crystal silicon substrate 3 has a main surface having a (110) plane orientation and is used for forming a source region, a drain region, and a channel formation region of a P-channel TFT. However, the present invention is not limited thereto. The single crystal silicon substrate 1 may have a main surface having the (110) plane orientation and be used for forming a source region, a drain region, and a channel formation region of a P-channel TFT, and the single crystal silicon substrate 3 has a main surface having the (100) plane orientation and be used for forming a source region, a drain region, and a channel formation region of an N-channel TFT.

As the insulating film 2 and the insulating film 4, a single layer of an insulating film such as a silicon oxide film, a silicon oxynitride film, a silicon nitride film, or a silicon nitride oxide film, or stacked layers of any of these films can be formed. Such an insulating film can be formed by a thermal oxidation method, a CVD method, a sputtering method, or the like.

Silicon oxynitride means a substance that contains oxygen and nitrogen so that the amount of oxygen is larger than that of nitrogen, preferably one containing oxygen, nitrogen, silicon, and hydrogen at concentrations of 50 to 70 at. %, 0.5 to 15 at. %, 25 to 35 at. %, and 0.1 to 10 at. %, respectively, when the composition is measured by Rutherford backscattering spectrometry (RBS) and hydrogen forward scattering spectrometry (HFS). Further, silicon nitride oxide means a substance that contains nitrogen and oxygen so that the amount of nitrogen is larger than that of oxygen, preferably one containing oxygen, nitrogen, silicon, and hydrogen at concentrations of 5 to 30 at. %, 20 to 55 at. %, 25 to 35 at. %, and 10 to 30 at. %, respectively, when the composition is measured by RBS and HFS. Note that percentages of nitrogen, oxygen, silicon, and hydrogen fall within the ranges given above, where the total number of atoms contained in silicon oxynitride or silicon nitride oxide is defined as 100 at. %.

In the case where a silicon oxide film is formed by a CVD method, organosilane such as tetraethoxysilane (abbreviation: TEOS, chemical formula: $SKOC_2H_5)_4$) is preferably used in terms of productivity.

In the case where a silicon oxide film is formed by thermally oxidizing the single crystal silicon substrate, a halogen is preferably added to an oxidation atmosphere. For example, thermal oxidation treatment is performed on the single crystal silicon substrate in an oxidation atmosphere to which chlorine (CO is added, whereby a silicon oxide film is formed through chlorine oxidation. In this case, the silicon oxide film contains chlorine atoms, for example, at a concentration of $1 \times 10^{17}$ to $1 \times 10^{21}$ atoms/cm$^3$.

For example, thermal oxidation treatment can be performed in an oxidation atmosphere which contains hydrogen chloride (HCl) at a proportion of 0.5 to 10 vol. % (preferably 3 vol. %) with respect to oxygen at a temperature of 900 to 1150° C. (typically 1000° C.). Treatment time may be 0.1 to 6 hours, preferably 0.5 to 1 hour. The thickness of the formed oxide film is 10 to 1000 nm (preferably 50 to 300 nm), and for example, the thickness is 100 nm.

With the chlorine atoms contained in the silicon oxide film, heavy metal (e.g., Fe, Cr, Ni, or Mo) that is an extrinsic impurity can be captured, so that contamination of the single crystal silicon substrate can be prevented. In addition, an impurity (e.g., a mobile ion such as Na) that adversely affects the single crystal silicon substrate can be gettered. That is, by heat treatment which is performed after the formation of the silicon oxide film, impurities included in the single crystal silicon substrate are separated out to the silicon oxide film and captured by reacting with the halogen (e.g., chlorine). Accordingly, contamination of the single crystal silicon substrate can be prevented.

In particular, it is effective that a halogen such as chlorine is contained in the silicon oxide film in a case where the semiconductor substrate is not sufficiently cleaned or in a case of removing contamination of the semiconductor substrate which is repeatedly used.

Further, halogen atoms contained in the silicon oxide film are not limited to the chlorine atoms. The silicon oxide film may contain fluorine atoms. In order to perform fluorine oxidation on a surface of the single crystal silicon substrate, thermal oxidation treatment may be performed in an oxidation atmosphere after immersion of the surface of the single crystal silicon substrate into hydrofluoric acid, or thermal oxidation treatment may be performed in an oxidation atmosphere to which $NF_3$ is added.

Figure 3B:
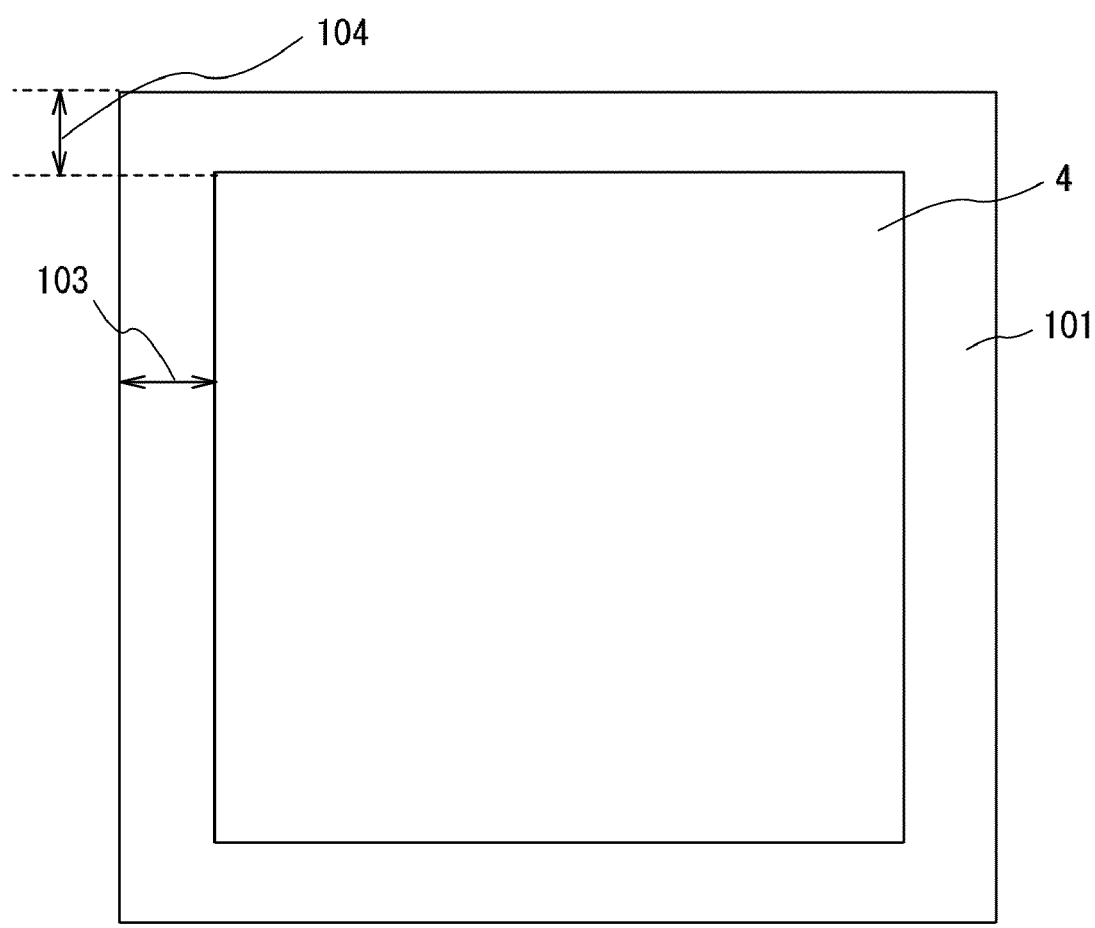

A mask (a first mask) 101 is selectively formed over the single crystal silicon substrate 3 with the insulating film 4 interposed therebetween. The mask 101 is formed of a resist, silicon oxide, or silicon nitride by a photolithography method (FIG. 3A). There is no limitation on a region in which the mask 101 is formed; however, since a region of the single crystal silicon substrate 3, which is covered with the mask 101 is removed in a later step, the mask 101 is formed over a peripheral portion so that the distance between the edge portion of the single crystal silicon substrate 3 and the inner edge of the mask 101 is 1.0 to 10.0 mm (FIG. 3B). That is, lengths 103 and 104 are each 1.0 to 10.0 mm FIG. 3B is a top view of FIG. 3A.

Figure 12A:
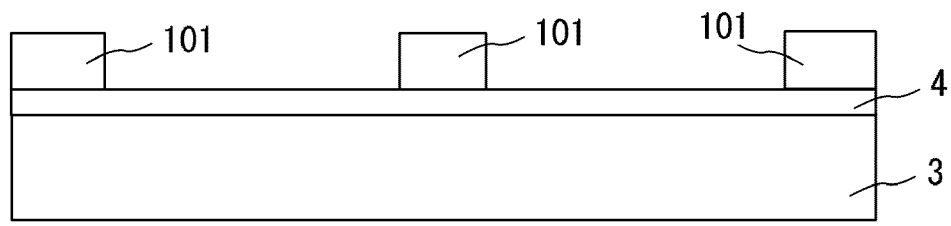
FIGS. 12A and 12B are views illustrating a manufacturing method of Embodiment 1.
Figure 12B:
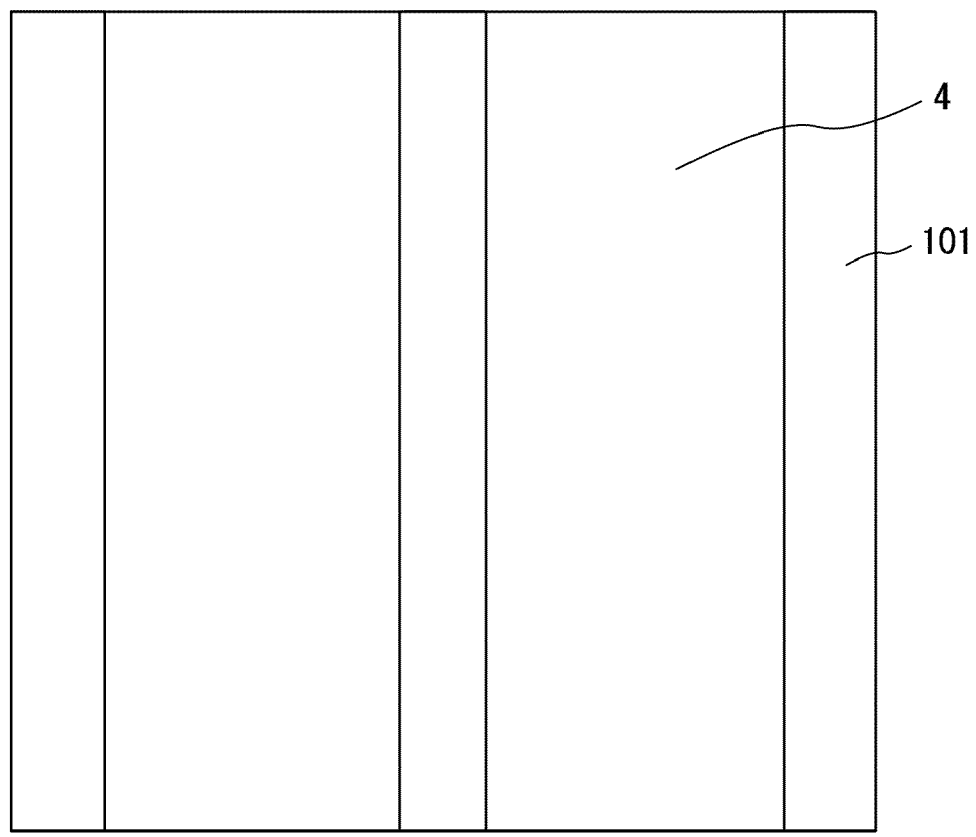
Figure 13A:
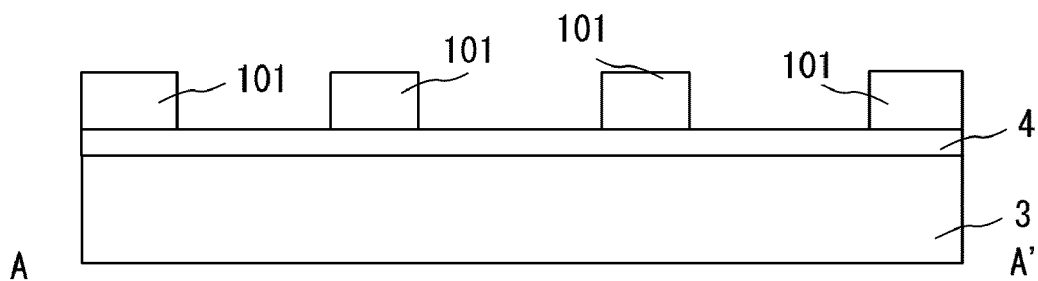
FIGS. 13A and 13B are views illustrating a manufacturing method of Embodiment 1.
Figure 13B:
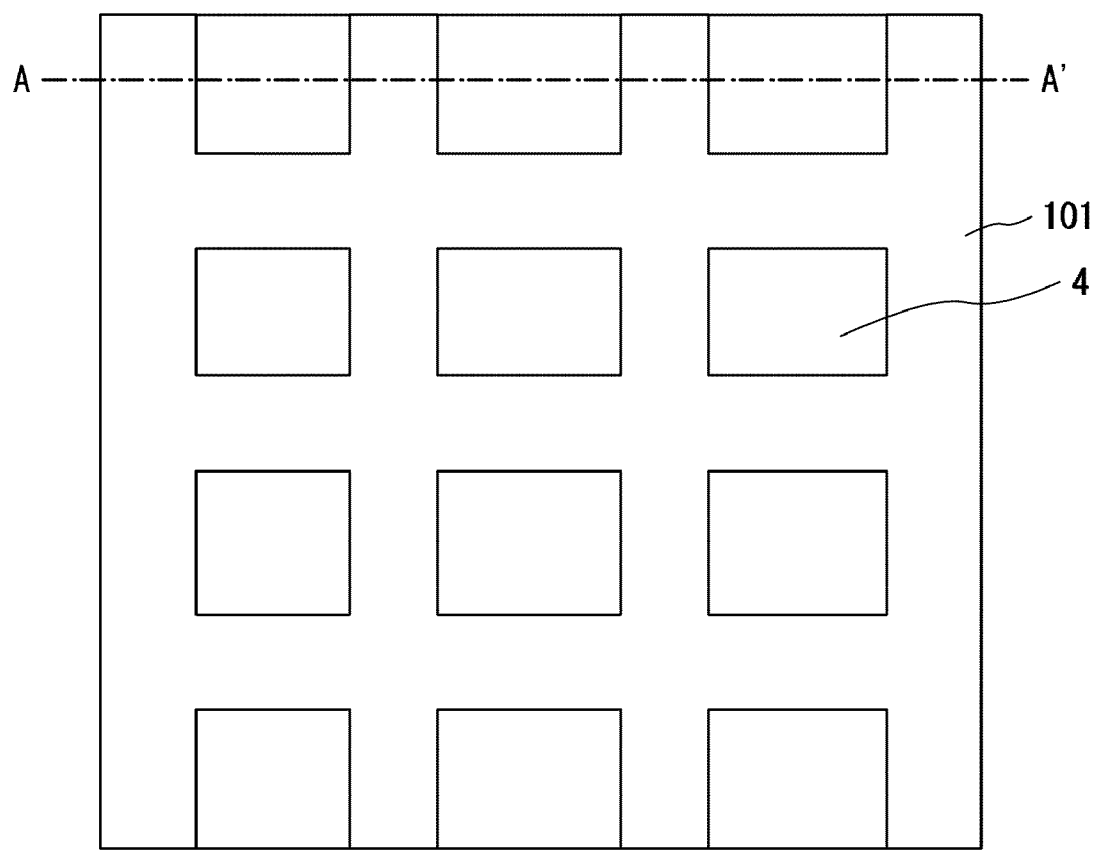

Note that the region in which the mask 101 is formed is not limited to the peripheral portion of the single crystal silicon substrate 3. As described above, the region of the single crystal silicon substrate 3, which is covered with the mask 101 is removed in a later step. In the case where the plane orientation of the main surface of the single crystal silicon substrate 3 is (110), a semiconductor layer for a P-channel TFT is formed from the single crystal silicon substrate 3. Thus, the mask 101 may be formed so as to cover a region in which the semiconductor layer is not formed. For example, the mask 101 may be formed in a linear shape over the insulating film 4 (FIGS. 12A and 12B). Alternatively, the mask 101 may be formed in a net-like shape (FIGS. 13A and 13B). The following steps are described assuming that the mask 101 is formed as illustrated in FIGS. 3A and 3B.

Figure 4A:
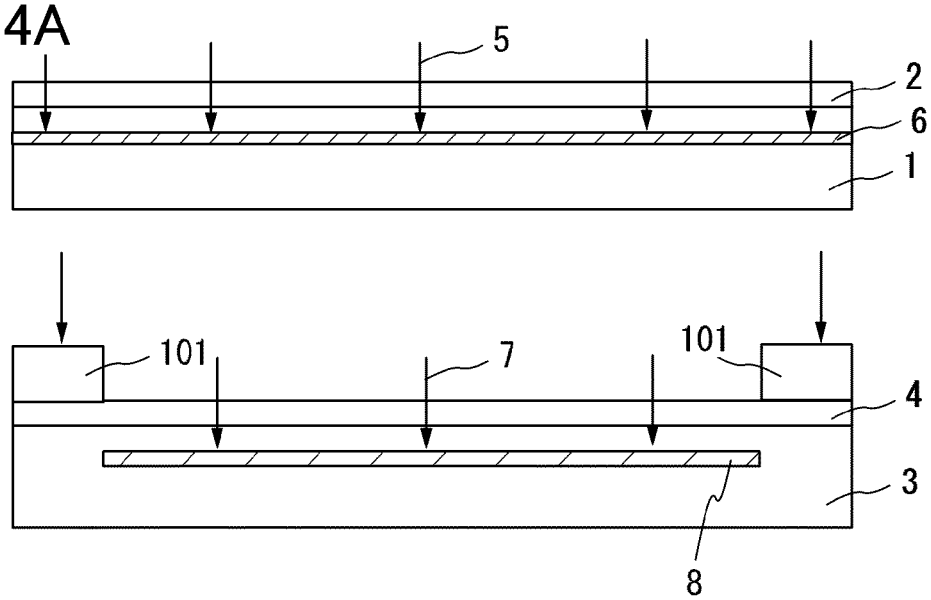
FIGS. 4A to 4C are views illustrating a manufacturing method of Embodiment 1.

The entire surface of the single crystal silicon substrate 1 is doped with ions (the first ions) 5, specifically with hydrogen ions, or hydrogen ions and helium ions through the insulating film 2, so that an embrittlement layer (the first embrittlement layer) 6 is formed (FIG. 4A). Hydrogen ions include at least one of $H^+$, $H_2^+$, and $H_3^+$. Hydrogen ions are generated from, for example, hydrogen ($H_2$), phosphine ($PH_3$), diborane ($B_2H_6$), or the like.

Although there is no particular limitation on the dose of the ions 5, the dose is $2.5 \times 10^{16}$ to $2.7 \times 10^{16}$ cm$^{-2}$ for example. With this dose, a single crystal silicon film (the first single crystal silicon film) 9 can be separated along the embrittlement layer 6 at 470 to 480° C. Energy of the ions 5 is adjusted so that the embrittlement layer 6 is formed at a depth of greater than or equal to 50 nm and less than or equal to 200 nm from the surface of the single crystal silicon substrate 1.

The single crystal silicon substrate 3 is also doped with ions (the second ions) 7 through the insulating film 4, so that an embrittlement layer (the second embrittlement layer) 8 is selectively formed (FIG. 4A). The ions 7 are the same kind of ions as the ions 5. In the single crystal silicon substrate 3, the embrittlement layer 8 is not formed in the region covered with the mask 101 in principle. However, the region covered with the mask 101 is doped with part of the ions 7 in some cases.

The dose of the ions 7 is smaller than the dose of the ions 5. For example, the dose of the ions 7 is $1.9 \times 10^{16}$ to $2.1 \times 10^{16}$ cm$^2$. With this dose, a single crystal silicon film (the second single crystal silicon film) 12 can be separated along the embrittlement layer 8 at 490° C. or higher, preferably at 490 to 500° C. When the dose of the ions 7 is smaller than the dose of the ions 5 by $0.5 \times 10^{16}$ to $1.0 \times 10^{16}$ cm$^2$, the temperature at which the single crystal silicon substrate 3 is separated along the embrittlement layer 8 can be set 10 to 20° C. higher than the temperature at which the single crystal silicon substrate 1 is separated along the embrittlement layer 6.

Energy of the ions 7 is adjusted so that the embrittlement layer 8 is formed at a depth of greater than or equal to 50 nm and less than or equal to 200 nm from the surface of the single crystal silicon substrate 3 in a similar manner to the case of the embrittlement layer 6.

The depths of regions in which the embrittlement layer 6 and the embrittlement layer 8 are formed are adjusted by kinetic energy, mass, charge, incident angle, or the like of the ions 5 and the ions 7. Note that the kinetic energy can be adjusted by acceleration voltage or the like.

In the above-described ion irradiation method, the percentage of H$_3$ with respect to the total amount of the generated ion species (H$^+$, H$_2^+$, and H$_3^+$) is 50% or higher, preferably 70% or higher. By irradiation with ions having the same mass, ions can be added in a concentrated manner to the same depth in the single crystal silicon substrates 1 and 3.

In order to form the embrittlement layer 6 and the embrittlement layer 8 in shallow regions, the acceleration voltage for the ions 5 and the ions 7 needs to be low. By increasing the percentage of H$_3^+$ ions in plasma, the ions can be added to the single crystal silicon substrates 1 and 3 efficiently.

After the embrittlement layer 8 is formed, the mask 101 is removed by an ashing method or the like.

Figure 4B:
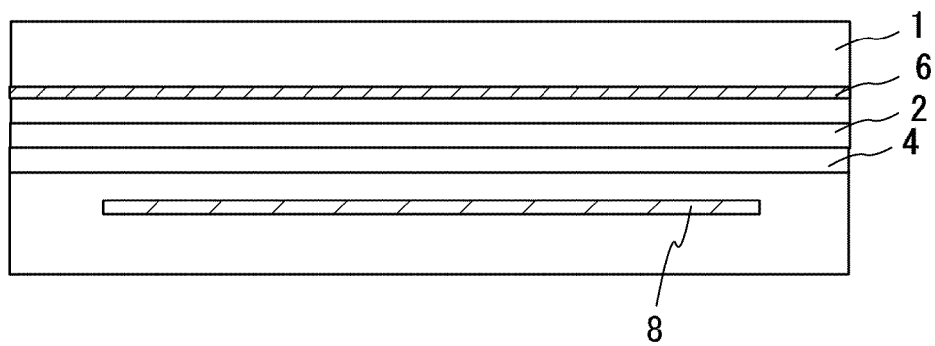

The single crystal silicon substrate 1 and the single crystal silicon substrate 3 are bonded to each other so that the insulating film 2 and the insulating film 4 face each other (FIG. 4B). Specifically, a surface of the insulating film 2 and a surface of the insulating film 4 are bonded to each other.

Figure 4C:
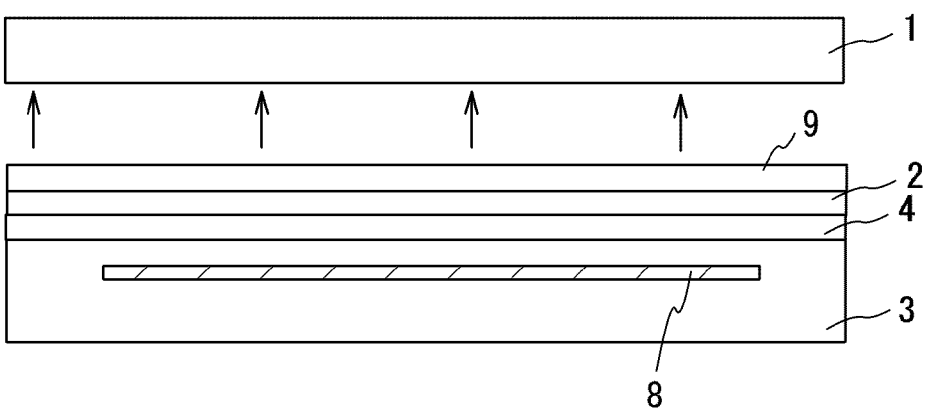

After the single crystal silicon substrate 1 and the single crystal silicon substrate 3 are bonded to each other, heat treatment is performed at 470 to 480° C. for 0.5 to 60 minutes. As the temperature rises, the ions introduced by doping are separated out into microvoids formed in the embrittlement layer 6, so that internal pressure is increased. As the pressure increases, the volume of the microvoids in the embrittlement layer 6 changes, so that the embrittlement layer 6 cracks. Thus, the single crystal silicon substrate 1 can be separated along the embrittlement layer 6. Since the insulating film 2 is bonded to the single crystal silicon substrate 3, the single crystal silicon film 9 separated from the single crystal silicon substrate 1 is formed over the single crystal silicon substrate 3 (FIG. 4C). The plane orientation of the main surface of the single crystal silicon film 9 is (100). On the other hand, since the dose of the ions 7 for the single crystal silicon substrate 3 is smaller than the dose of the ions 5 for the single crystal silicon substrate 1, the single crystal silicon substrate 3 is not separated along the embrittlement layer 8 by the heat treatment at this time (FIG. 4C).

When the surface of the single crystal silicon film 9 is uneven, planarization is performed by chemical mechanical polishing (CMP) or the like. Further, by performing excimer laser annealing, RTA, flash lamp annealing, or the like on the single crystal silicon film 9, the surface of the single crystal silicon film 9 can be planarized and crystallinity of the single crystal silicon film 9 can be recovered.

Figure 5A:
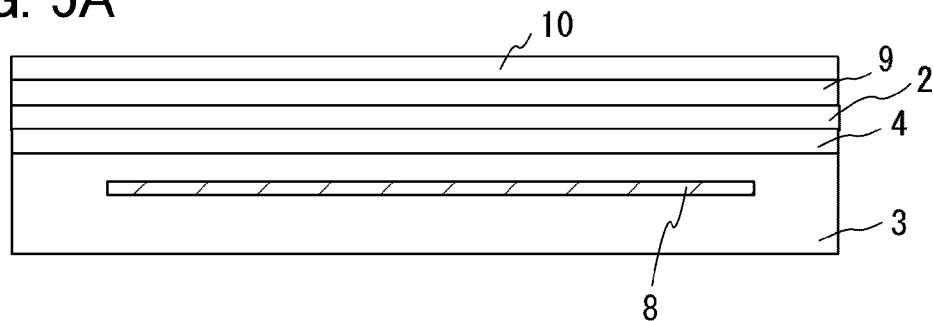
FIGS. 5A to 5C are views illustrating a manufacturing method of Embodiment 1.

An insulating film (the third insulating film) 10 is formed over the single crystal silicon film 9 by a CVD method, a sputtering method, or the like (FIG. 5A). The insulating film 10 may be an insulating film similar to the insulating film 2 and the insulating film 4.

Figure 5B:
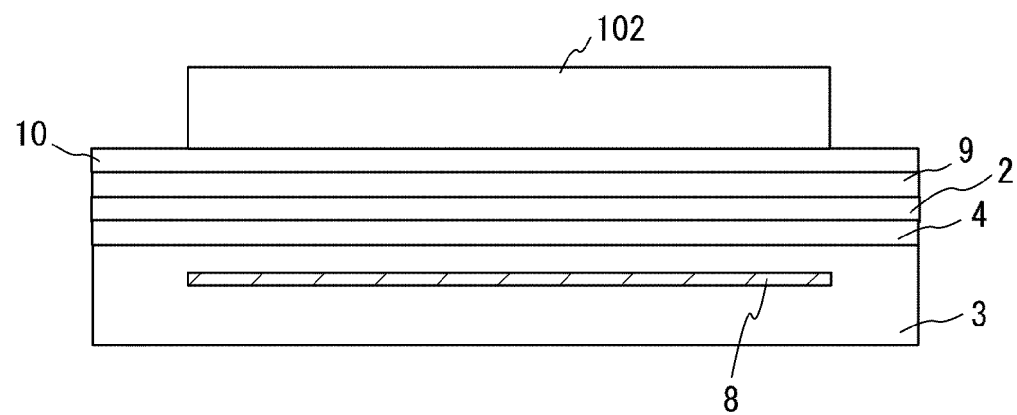
Figure 5C:
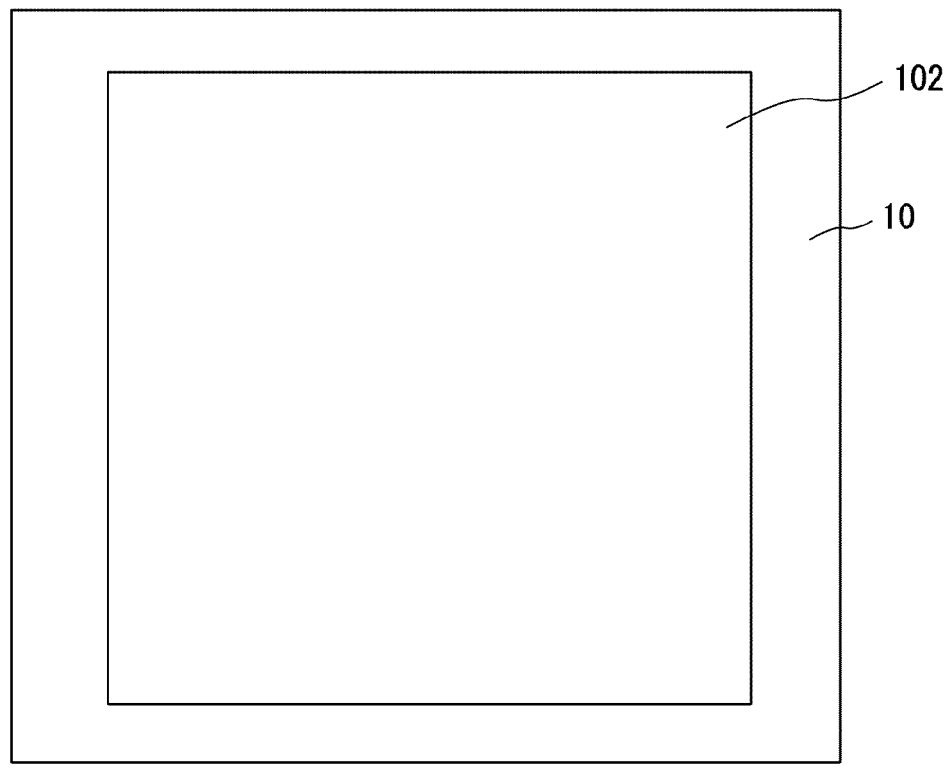

A mask (a second mask) 102 is formed over the insulating film 10 (FIG. 5B). The mask 102 is formed over the insulating film 10 so as to cover the embrittlement layer 8. The mask 102 may be formed in a manner similar to that of the mask 101. The mask 102 may be formed so as to cover the embrittlement layer 8, and there is no limitation on how much the mask 102 covers the embrittlement layer 8. However, a region of the single crystal silicon substrate 3, which is not covered with the mask 102 is removed in a later step; therefore, it is preferable that the mask 102 entirely cover the embrittlement layer 8 (FIG. 5C). FIG. 5C is a top view of FIG. 5B.

Figure 6A:
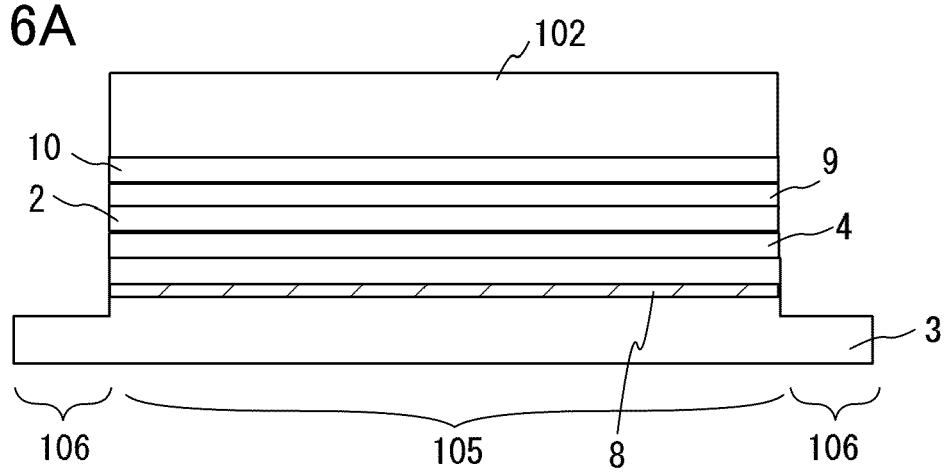
FIGS. 6A to 6C are views illustrating a manufacturing method of Embodiment 1.

The region which is not covered with the mask 102 is removed by a dry etching method or the like (FIG. 6A). Peripheral portions of the insulating film 10, the single crystal silicon film 9, the insulating film 2, the insulating film 4, and the single crystal silicon substrate 3 are removed. As for the single crystal silicon substrate 3, the region covered by the mask 101, that is, the peripheral portion of the single crystal silicon substrate 3 is removed as described above. Further, the single crystal silicon substrate 3 is removed down to a depth that is deeper than the region in which the embrittlement layer 8 is formed. Thus, the single crystal silicon substrate 3 includes a projection region 105 in which the embrittlement layer 8 is formed, and a depression region 106.

The mask 102 is removed by an ashing method or the like.

Figure 6B:
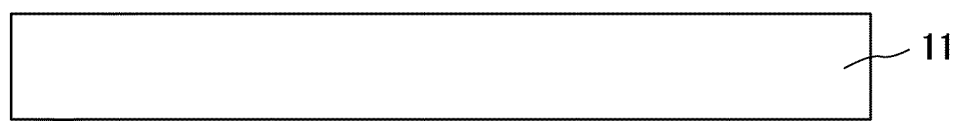
Figure 6B:
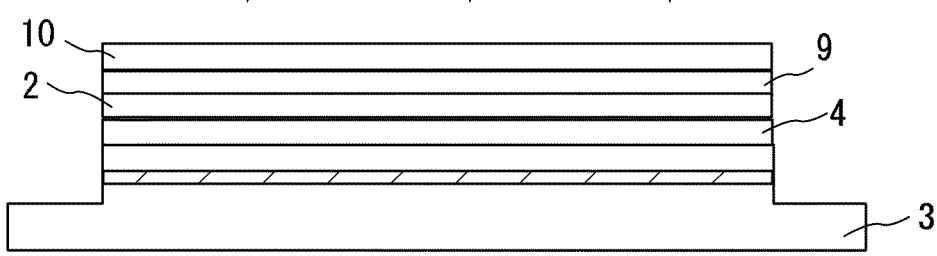
Figure 6C:
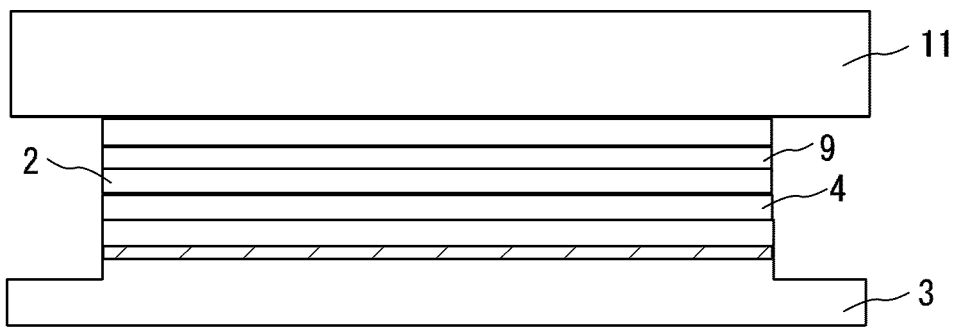

Next, a base substrate 11 is prepared (FIG. 6B), and the single crystal silicon substrate 3 and the base substrate 11 are bonded to each other (FIG. 6C). Specifically, a surface of the insulating film 10 and a surface of the base substrate 11 are bonded to each other.

As the base substrate 11, for example, a substrate formed of an insulator can be used. For example, a glass substrate is preferably used. Specifically, a variety of glass substrates that are used in the electronics industry, such as substrates of aluminosilicate glass, aluminoborosilicate glass, and barium borosilicate glass; quartz substrates; ceramic substrates; and sapphire substrates can be given. In addition, as the base substrate 11, a single crystal semiconductor substrate (e.g., a single crystal silicon substrate) or a polycrystalline semiconductor substrate (e.g., a polycrystalline silicon substrate) may be used.

Cost reduction can be achieved when a glass substrate which can have a larger size and is inexpensive is used as the base substrate 11. For example, a mother glass substrate having a large area, such as the sixth generation (1500 mm×1850 mm), the seventh generation (1870 mm×2200 mm), or the eighth generation (2200 mm×2400 mm) is used and a plurality of single crystal silicon substrates are bonded to the mother glass substrate to manufacture an SOI substrate, whereby the SOI substrate can have a large area.

Figure 7A:
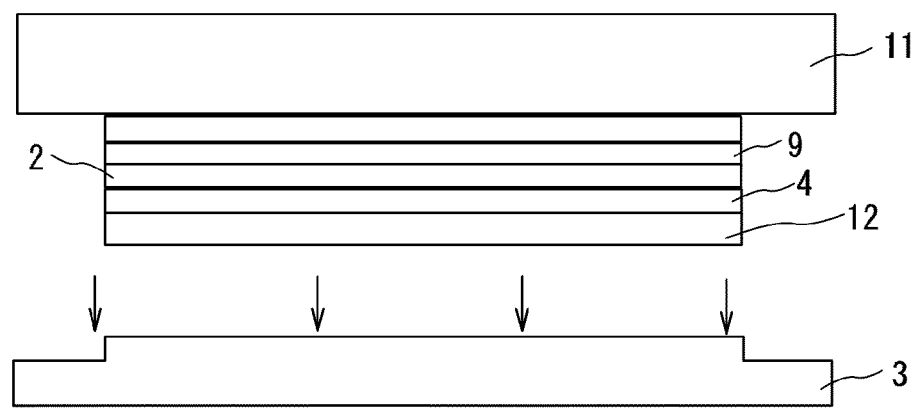
FIGS. 7A to 7C are views illustrating a manufacturing method of Embodiment 1.

After the single crystal silicon substrate 3 is bonded to the base substrate 11, heat treatment is performed at 490° C. or higher, preferably at 490 to 500° C. for 0.5 to 60 minutes, whereby the single crystal silicon substrate 3 can be separated along the embrittlement layer 8. Thus, the single crystal silicon film 9 separated from the single crystal silicon substrate 1 and the single crystal silicon film 12 separated from the single crystal silicon substrate 3 are formed over the base substrate 11 (FIG. 7A). The single crystal silicon film 9, the insulating film 10, and the single crystal silicon film 12 are stacked. The plane orientation of the main surface of the single crystal silicon film 12 is (110).

When the surface of the single crystal silicon film 12 is uneven, planarization is performed by chemical mechanical polishing (CMP) or the like. Further, by performing excimer laser annealing, RTA, flash lamp annealing, or the like on the single crystal silicon film 12, the surface of the single crystal silicon film 12 can be planarized and crystallinity of the single crystal silicon film 12 can be recovered.

Figure 7B:
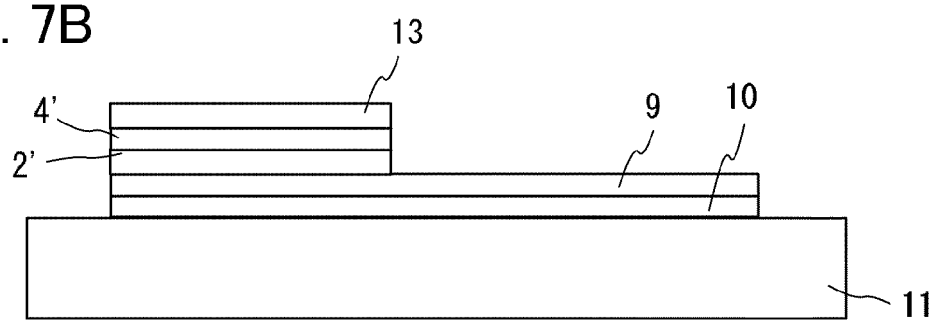

Next, the single crystal silicon film 12 is selectively removed by a photolithography method, thereby forming an island-like single crystal silicon film 13. Then, the insulating film 2 and the insulating film 4 are partially removed so that the single crystal silicon film 9 is exposed (FIG. 7B). An island-like insulating film 2', an island-like insulating film 4', and the island-like single crystal silicon film 13 are formed over the single crystal silicon film 9.

Figure 7C:
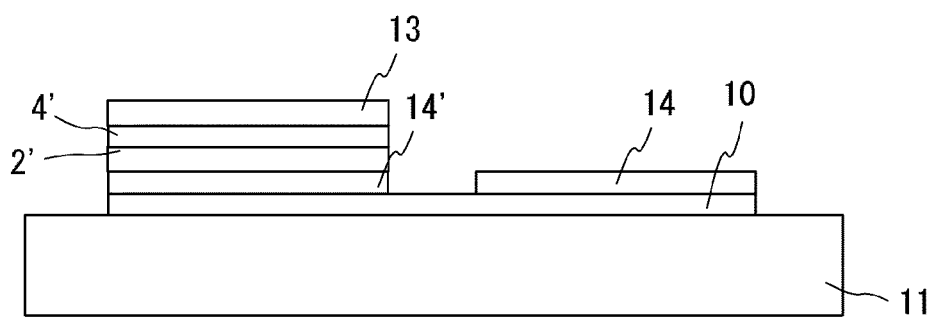

The single crystal silicon film 9 is selectively removed by a photolithography method, thereby forming an island-like single crystal silicon film 14 (FIG. 7C). The island-like single crystal silicon film 13 is formed above an island-like single crystal silicon film 14'.

Through the above-described steps, the island-like single crystal silicon film 14 whose main surface has the (100) plane orientation and the island-like single crystal silicon film 13 whose main surface has the (110) plane orientation can be formed over the base substrate 11. That is, an SOI substrate including the single crystal silicon film 14 whose plane orientation is (100) and the single crystal silicon film 13 whose plane orientation is (110) can be manufactured.

Note that in the case where the plane orientation of the main surface of the single crystal silicon substrate 1 is (110) and the plane orientation of the main surface of the single crystal silicon substrate 3 is (100), the island-like single crystal silicon film 13 whose main surface has the (100) plane orientation and the island-like single crystal silicon film 14 whose main surface has the (110) plane orientation can be formed over the base substrate 11.

With the use of the island-like single crystal silicon films 13 and 14, a P-channel TFT and an N-channel TFT are formed over the base substrate 11.

Embodiment 2

Next, steps for forming a source region, a drain region, and a channel region of a P-channel TFT and a source region, a drain region, and a channel region of an N-channel TFT with the use of the island-like single crystal silicon film 13 and the island-like single crystal silicon film 14 which are formed in Embodiment 1 will be described. Note that the description is made assuming that the island-like single crystal silicon film 13 is an island-like single crystal silicon film whose main surface has the (110) plane orientation and that the island-like single crystal silicon film 14 is an island-like single crystal silicon film whose main surface has the (100) plane orientation.

Figure 8A:
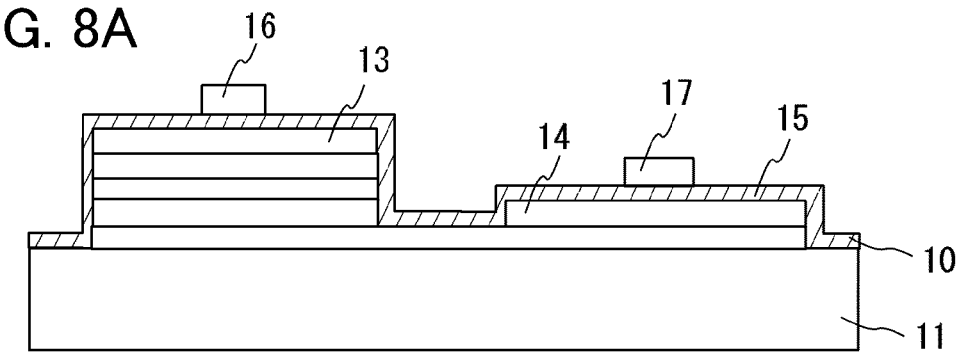
FIGS. 8A to 8C are views illustrating a manufacturing method of Embodiment 2.

A gate insulating film 15 is formed over the island-like single crystal silicon film 13 and the island-like single crystal silicon film 14. Gate electrodes 16 and 17 are formed over the gate insulating film 15 (FIG. 8A).

Figure 8B:
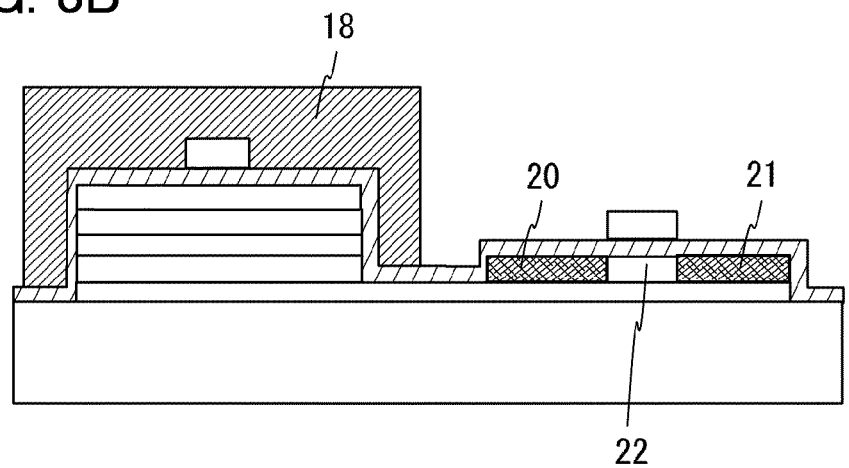

After the gate electrodes 16 and 17 are formed, the island-like single crystal silicon film 13 is covered by a resist mask 18 (FIG. 8B). An N-type impurity element (phosphorus or arsenic) is added to the island-like single crystal silicon film 14 by an ion doping method or an ion implantation method with the use of the gate electrode 17 as a mask. N-type impurity regions 20 and 21 are formed in the island-like single crystal silicon film 14 in a self-aligned manner. The N-type impurity regions 20 and 21 function as a source region and a drain region, respectively. In the island-like single crystal silicon film 14, a region overlapping with the gate electrode 17 functions as a channel formation region 22 (FIG. 8B).

Figure 8C:
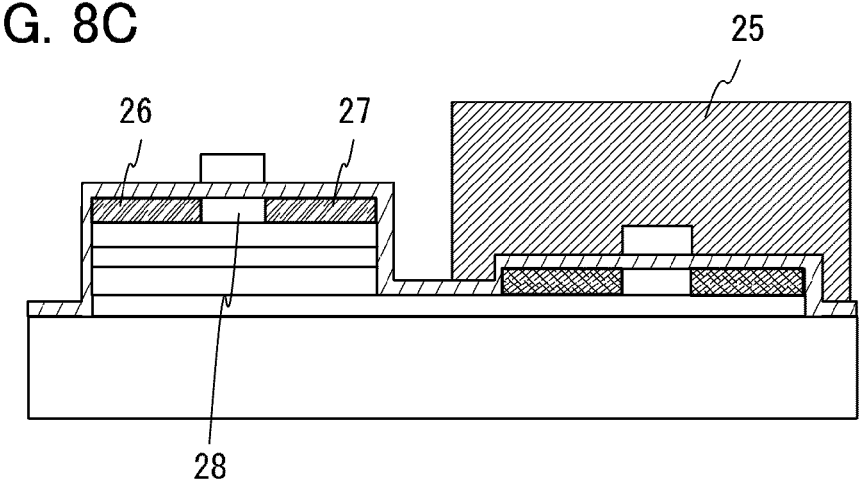

After the resist mask 18 is removed, the island-like single crystal silicon film 14 is covered by a resist mask 25 (FIG. 8C). A P-type impurity element (boron) is added to the island-like single crystal silicon film 13 by an ion doping method or an ion implantation method with the use of the gate electrode 16 as a mask. P-type impurity regions 26 and 27 are formed in the island-like single crystal silicon film 13 in a self-aligned manner. The P-type impurity regions 26 and 27 function as a source region and a drain region, respectively. In the island-like single crystal silicon film 13, a region overlapping with the gate electrode 16 functions as a channel formation region 28 (FIG. 8C). A method in which the N-type impurity regions 20 and 21 are formed and then the P-type impurity regions 26 and 27 are formed is described here; however, the P-type impurity regions 26 and 27 may be formed first. Note that the source regions 20 and 26, the drain regions 21 and 27, and the channel formation regions 22 and 28 are formed in the island-like single crystal silicon films 13 and 14, respectively; however, an LDD region or an off-set region may also be formed if necessary.

Note that in the case where the island-like single crystal silicon film 13 is an island-like single crystal silicon film whose main surface has the (100) plane orientation and the island-like single crystal silicon film 14 is an island-like single crystal silicon film whose main surface has the (110) plane orientation, an N-type impurity element is added to the island-like single crystal silicon film 13 and a P-type impurity element is added to the island-like single crystal silicon film 14.

After the resist mask 25 is removed, heat treatment is performed to activate the impurity elements introduced by doping.

After the heat treatment, an insulating film 30 containing hydrogen is formed. Heat treatment is performed at a temperature of higher than or equal to 350° C. and lower than or equal to 450° C., whereby hydrogen contained in the insulating film 30 is diffused in the island-like single crystal silicon films 13 and 14. Silicon nitride or silicon nitride oxide formed by a plasma CVD method is used for the insulating film 30. The hydrogen supplied to the island-like single crystal silicon films 13 and 14 terminates dangling bonds in the island-like single crystal silicon films 13 and 14.

Figure 9:
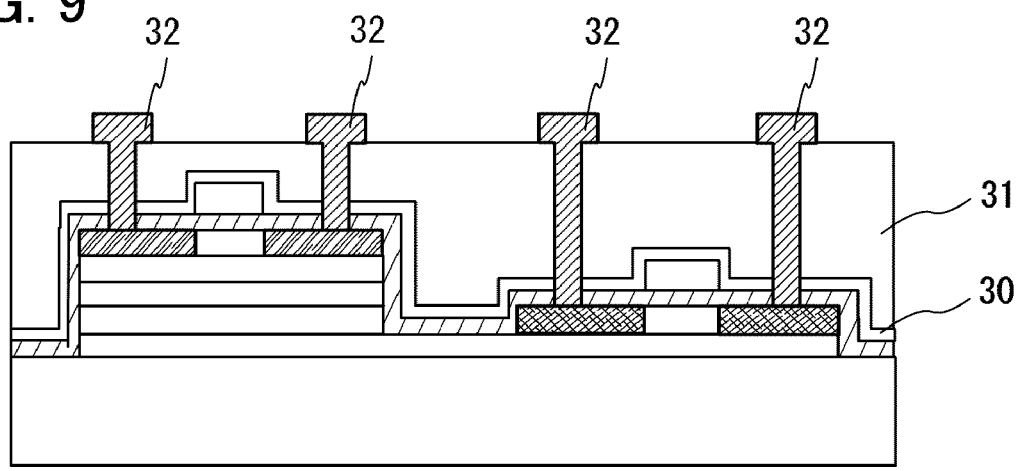
FIG. 9 is a view illustrating a manufacturing method of Embodiment 2.

An interlayer insulating film 31 is formed (FIG. 9). The interlayer insulating film 31 has a single-layer structure of a film selected from insulating films of inorganic materials, such as a silicon oxide film and a borophosphosilicate glass (BPSG) film, and organic resin films of polyimide, acrylic, and the like, or has a stacked structure of any of the above films. After contact holes are formed in the interlayer insulating film 31, wirings 32 are formed (FIG. 9). The wirings 32 serve as source electrodes and drain electrodes. The wirings 32 can be formed of a conductive film with a three-layer structure in which a low-resistance metal film such as an aluminum film or an aluminum alloy film is interposed between barrier metal films. The barrier metal films are metal films of molybdenum, chromium, titanium, or the like.

Through the above-described steps, a semiconductor device having the N-channel TFT and the P-channel TFT can be manufactured.

Embodiment 3

Figure 10A:
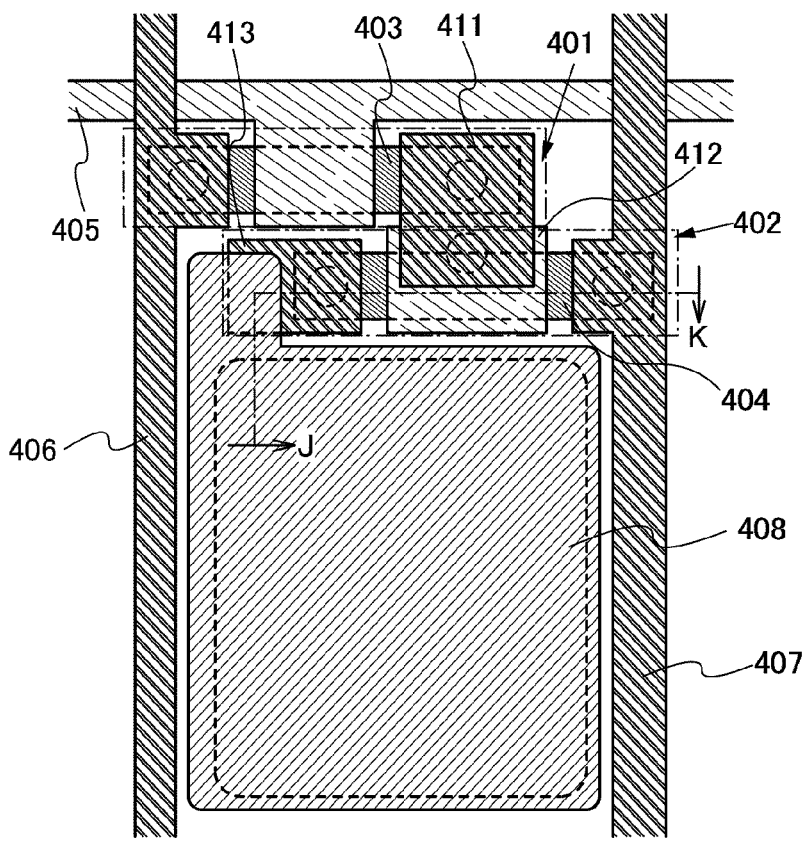
FIGS. 10A and 10B are views illustrating a manufacturing method of Embodiment 3.
Figure 10B:
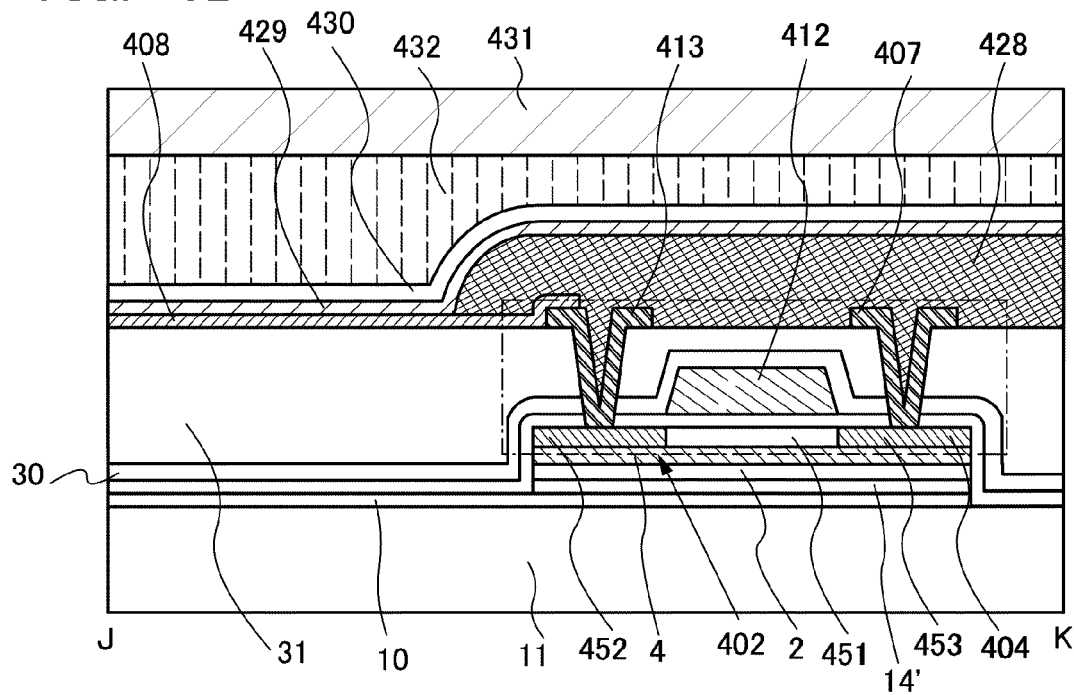

An electroluminescent display device (hereinafter referred to as an EL display device) including a semiconductor device having an N-channel TFT and a P-channel TFT will be described (FIGS. 10A and 10B). FIG. 10A is a plan view of a pixel of the EL display device, and FIG. 10B is a cross-sectional view taken along line J-K in FIG. 10A.

A pixel region includes a selection transistor 401 and a display control transistor 402, a scan line 405, a signal line 406, a current supply line 407, and a pixel electrode 408. Each pixel is provided with a light-emitting element having a structure in which a layer including an electroluminescent material (this layer is also referred to as an EL layer) is sandwiched between a pair of electrodes. One of the electrodes of the light-emitting element is the pixel electrode 408. Further, in an island-like single crystal silicon film 403, a channel formation region, a source region, and a drain region of the selection transistor 401 are formed. In an island-like single crystal silicon film 404, a channel formation region 451, a source region 452, and a drain region 453 of the display control transistor 402 are formed. The island-like single crystal silicon films 403 and 404 correspond to the island-like single crystal silicon films 14 and 13 provided over the base substrate, respectively.

The selection transistor 401 is an N-channel TFT. A gate electrode of the selection transistor 401 is included in the scan line 405, one of a source electrode and a drain electrode is included in the signal line 406, and the other thereof is formed as an electrode 411. The display control transistor 402 is a P-channel TFT. A gate electrode 412 of the display control transistor 402 is electrically connected to the electrode 411, one of a source electrode and a drain electrode is an electrode 413 which is electrically connected to the pixel electrode 408, and the other thereof is included in the current supply line 407.

The interlayer insulating film 31 is formed to cover the gate electrode 412. Over the interlayer insulating film 31, the signal line 406, the current supply line 407, the electrode 411, the electrode 413, and the like are formed. Over the interlayer insulating film 31, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate and is fixed by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method. In order to employ the current driving method, a correction circuit which corrects characteristic variation is needed. When the EL display device is manufactured by a manufacturing method including a manufacturing process of an SOI substrate, the selection transistor 401 and the display control transistor 402 do not have variation in electrical characteristics from pixel to pixel. Accordingly, the current driving method can be employed.

Various electronic devices can be manufactured with the use of SOI substrates. The electronic devices include, in its category, cameras such as video cameras and digital cameras, navigation systems, audio reproducing devices (such as car audio systems and audio components), computers, game machines, portable information terminals (such as mobile computers, mobile phones, portable game machines, and e-book readers), and image reproducing devices having recording media (specifically, devices provided with display devices capable of reproducing audio data stored in recording media such as a digital versatile disk (DVD) and displaying stored image data). An example of such an electronic device is illustrated in FIGS. 11A to 11C.

Figure 11A:
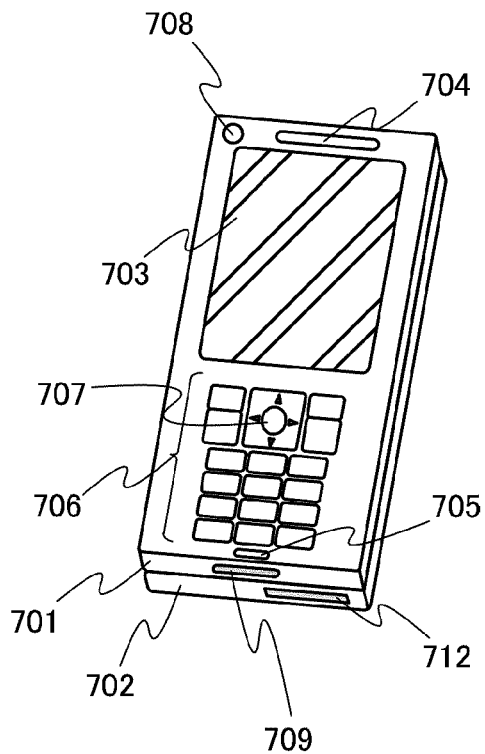
FIGS. 11A to 11C are views illustrating a mobile phone of Embodiment 3.
Figure 11B:
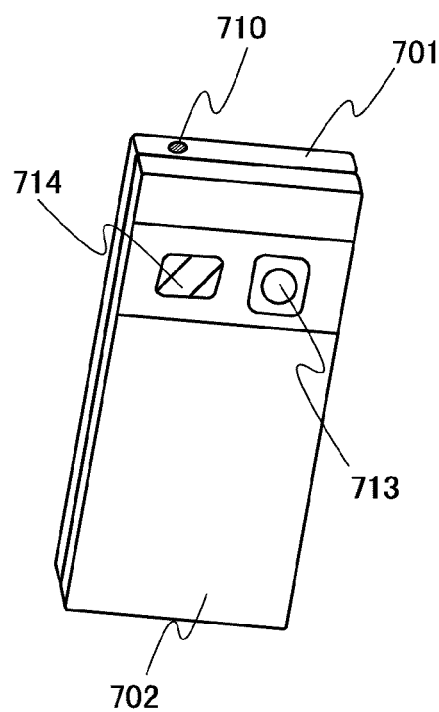
Figure 11C:
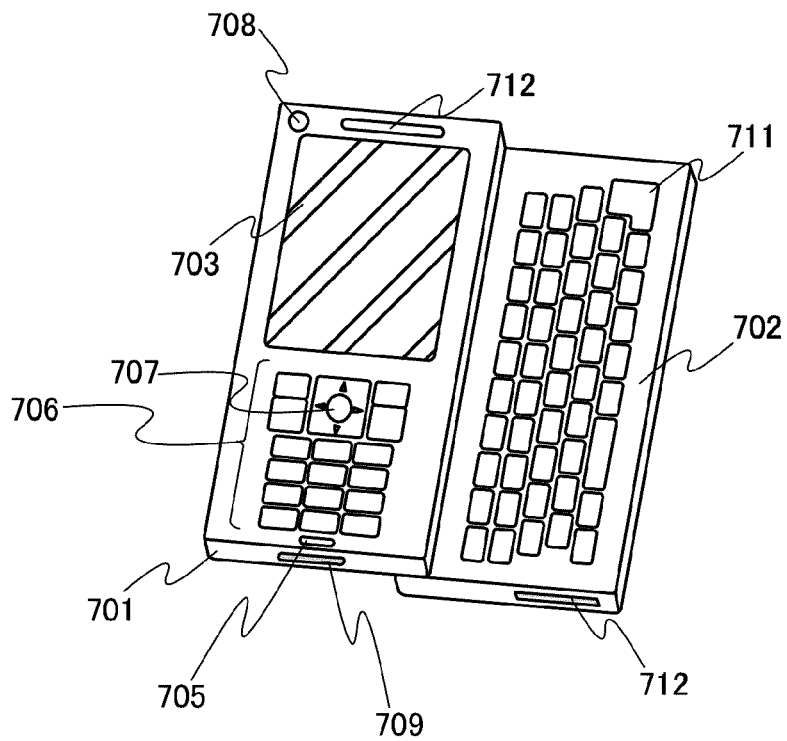

FIGS. 11A to 11C illustrate an example of a mobile phone to which the present invention is applied. FIG. 11A is a front view, FIG. 11B is a rear view, and FIG. 11C is a front view in which two housings slide. A mobile phone 700 includes two housings 701 and 702. The mobile phone 700 is a so-called smartphone which has both functions of a mobile phone and a portable information terminal, and incorporates a computer and can perform a variety of data processing in addition to voice calls.

The mobile phone 700 includes the housing 701 and the housing 702. The housing 701 includes a display portion 703, a speaker 704, a microphone 705, operation keys 706, a pointing device 707, a front camera lens 708, a jack 709 for an external connection terminal, an earphone terminal 710, and the like, while the housing 702 includes a keyboard 711, an external memory slot 712, a rear camera 713, a light 714, and the like. In addition, an antenna is incorporated in the housing 701.

In addition to the above-described structure, a non-contact IC chip, a small-size memory device, or the like may be incorporated in the mobile phone 700.

The housings 701 and 702 overlapping with each other (FIG. 11A) can slide and can be developed as illustrated in FIG. 11C. A display panel or a display device manufactured by the manufacturing method of the display device described in Embodiment 1 and Embodiment 2 can be incorporated in the display portion 703. Since the display portion 703 and the front camera lens 708 are provided in the same plane, the mobile phone 700 can be used as a videophone. A still image and a moving image can be taken by the rear camera 713 and the light 714 by using the display portion 703 as a viewfinder.

By using the speaker 704 and the microphone 705, the mobile phone 700 can be used as an audio recording device (sound recorder) or an audio reproducing device. With the use of the operation keys 706, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 700 as a portable information terminal, the use of the keyboard 711 is convenient. The housings 701 and 702 overlapping with each other (FIG. 11A) slide and can be developed as illustrated in FIG. 11C. In the case where the mobile phone 700 is used as a portable information terminal, smooth operation with the keyboard 711 and the pointing device 707 can be performed. The jack 709 for an external connection terminal can be connected to various cables such as an AC adapter or a USB cable, whereby the mobile phone 700 can be charged or can perform data communication with a personal computer or the like. Moreover, by inserting a recording medium into the external memory slot 712, the mobile phone 700 can deal with storing and moving a large capacity of data.

In the rear surface of the housing 702 (FIG. 11B), the rear camera 713 and the light 714 are provided, and a still image and a moving image can be taken by using the display portion 703 as a viewfinder.

Further, the mobile phone 700 may have an infrared communication function, a USB port, a function of receiving one segment television broadcast, a non-contact IC chip, an earphone jack, or the like, in addition to the above-described functions and structures.

The electronic device illustrated in FIGS. 11A to 11C can be manufactured by application of the above-described manufacturing method.

Note that the structure described in this embodiment can be implemented in combination with any of the structures described in the other embodiments in this specification.

This application is based on Japanese Patent Application serial no. 2008-290500 filed with Japanese Patent Office on Nov. 13, 2008, the entire contents of which are hereby incorporated by reference.

What is claimed is:

1. A method for manufacturing a semiconductor device, comprising the steps of:
    forming a first insulating film over a surface of a first single crystal silicon substrate;
    forming a second insulating film over a surface of a second single crystal silicon substrate;
    doping an entire surface of the first single crystal silicon substrate with first ions through the first insulating film to form a first embrittlement layer in the first single crystal silicon substrate;
    doping the second single crystal silicon substrate with second ions through the second insulating film to selectively form a second embrittlement layer in the second single crystal silicon substrate;
    bonding the first single crystal silicon substrate and the second single crystal silicon substrate to each other with the first insulating film and the second insulating film interposed therebetween;
    separating part of the first single crystal silicon substrate along the first embrittlement layer by first heat treatment to form a first single crystal silicon film over the second single crystal silicon substrate with the first insulating film and the second insulating film interposed therebetween;
    forming a third insulating film over the first single crystal silicon film;
    removing a region of the second single crystal silicon substrate, in which the second embrittlement layer is not formed;
    bonding a base substrate and the second single crystal silicon substrate to each other with the third insulating film interposed therebetween;
    separating part of the second single crystal silicon substrate along the second embrittlement layer by second heat treatment to form a second single crystal silicon film over the base substrate with the first insulating film and the second insulating film interposed therebetween;
    selectively removing the second single crystal silicon film to form an island-like second single crystal silicon film, and removing part of the first insulating film and part of the second insulating film to expose the first single crystal silicon film; and
    selectively removing the first single crystal silicon film to form an island-like first single crystal silicon film,
    wherein in the case where a plane orientation of a main surface of the first single crystal silicon substrate is (100), a plane orientation of a main surface of the second single crystal silicon substrate is (110),
    wherein in the case where the plane orientation of the main surface of the first single crystal silicon substrate is (110), the plane orientation of the main surface of the second single crystal silicon substrate is (100),
    wherein a dose of the second ions is smaller than a dose of the first ions, and
    wherein a temperature of the second heat treatment is higher than a temperature of the first heat treatment.

2. The method for manufacturing a semiconductor device, according to claim 1,
    wherein the first ions and the second ions include at least one of $H^+$, $H_2^+$, and $H_3^+$,
    wherein the dose of the first ions is $2.5 \times 10^{16}$ to $2.7 \times 10^{16}$ $cm^{-2}$,
    wherein the dose of the second ions is $1.9 \times 10^{16}$ to $2.1 \times 10^{16}$ $cm^{-2}$,
    wherein the temperature of the first heat treatment is 470 to 480° C., and
    wherein the temperature of the second heat treatment is 490° C. or higher.

3. A method for manufacturing a semiconductor device, comprising the steps of:
    forming a first insulating film over a surface of a first single crystal silicon substrate;
    forming a second insulating film over a surface of a second single crystal silicon substrate;
    forming a first mask which entirely covers a peripheral portion of the second single crystal silicon substrate over the second insulating film;
    doping an entire surface of the first single crystal silicon substrate with first ions through the first insulating film to form a first embrittlement layer in the first single crystal silicon substrate;
    doping the second single crystal silicon substrate with second ions through the second insulating film with the use of the first mask to selectively form a second embrittlement layer in the second single crystal silicon substrate;
    removing the first mask;
    bonding the first single crystal silicon substrate and the second single crystal silicon substrate to each other with the first insulating film and the second insulating film interposed therebetween;
    separating part of the first single crystal silicon substrate along the first embrittlement layer by first heat treatment to form a first single crystal silicon film over the second single crystal silicon substrate with the first insulating film and the second insulating film interposed therebetween;
    forming a third insulating film over the first single crystal silicon film;
    forming a second mask which entirely covers the second embrittlement layer over the third insulating film;
    removing a peripheral portion of the third insulating film, a peripheral portion of the first insulating film, a peripheral portion of the second insulating film, and the peripheral portion of the second single crystal silicon substrate with the use of the second mask;
    bonding a base substrate and the second single crystal silicon substrate to each other with the third insulating film interposed therebetween;

separating part of the second single crystal silicon substrate along the second embrittlement layer by second heat treatment to form a second single crystal silicon film over the base substrate with the first insulating film and the second insulating film interposed therebetween;

selectively removing the second single crystal silicon film to form an island-like second single crystal silicon film, and removing part of the first insulating film and part of the second insulating film to expose the first single crystal silicon film; and selectively removing the first single crystal silicon film to form an island-like first single crystal silicon film, wherein in the case where a plane orientation of a main surface of the first single crystal silicon substrate is (100), a plane orientation of a main surface of the second single crystal silicon substrate is (110), wherein in the case where the plane orientation of the main surface of the first single crystal silicon substrate is (110), the plane orientation of the main surface of the second single crystal silicon substrate is (100), wherein a dose of the second ions is smaller than a dose of the first ions, and wherein a temperature of the second heat treatment is higher than a temperature of the first heat treatment.

4. The method for manufacturing a semiconductor device, according to claim 3, wherein the first ions and the second ions include at least one of $H^+$, $H_2^+$, and $H_3^+$, wherein the dose of the first ions is $2.5\times10^{16}$ to $2.7\times10^{16}$ $cm^{-2}$, wherein the dose of the second ions is $1.9\times10^{16}$ to $2.1\times10^{16}$ $cm^{-2}$, wherein the temperature of the first heat treatment is 470 to 480° C., and wherein the temperature of the second heat treatment is 490° C. or higher.

* * * * *